US012665030B2

(12) United States Patent
Lin et al.

(10) Patent No.: US 12,665,030 B2
(45) Date of Patent: Jun. 23, 2026

(54) DATA INVERSION ENCODING CIRCUIT, eFLASH MEMORY DEVICE AND OPERATION METHOD THEREOF

(71) Applicant: United Microelectronics Corp., Hsinchu (TW)

(72) Inventors: Ying-Ting Lin, Hsinchu County (TW); Chien Kuo Su, Taoyuan City (TW); Hsueh-Chen Cheng, Hsinchu County (TW); Cheng-Hsiao Lai, Chiayi County (TW); Yuan-Hui Chen, Hsinchu City (TW); Ya-Nan Mou, Hsinchu City (TW)

(73) Assignee: United Microelectronics Corp., Hsinchu (TW)

( * ) Notice: Subject to any disclaimer, the term of this patent is extended or adjusted under 35 U.S.C. 154(b) by 86 days.

(21) Appl. No.: 18/755,707

(22) Filed: Jun. 27, 2024

(65) Prior Publication Data

US 2025/0372174 A1     Dec. 4, 2025

(30) Foreign Application Priority Data

Jun. 4, 2024     (TW) ................................. 113120646

(51) Int. Cl.
G11C 16/10      (2006.01)
G11C 16/08      (2006.01)
G11C 16/26      (2006.01)
G11C 29/52      (2006.01)

(52) U.S. Cl.
CPC ............ *G11C 16/102* (2013.01); *G11C 16/08* (2013.01); *G11C 16/26* (2013.01); *G11C 29/52* (2013.01)

(58) Field of Classification Search
CPC ....... G11C 16/102; G11C 16/08; G11C 16/26; G11C 29/52; G11C 16/10; G11C 29/42
USPC .................................................... 365/189.011
See application file for complete search history.

(56) References Cited

U.S. PATENT DOCUMENTS 9,564,238 B1     2/2017  Bai et al.
2005/0162438 A1*  7/2005  Nakata ..................... G06F 9/345
                                                          712/E9.039
2019/0340067 A1*  11/2019  Kim ..................... G06F 11/1068
2025/0140333 A1*  5/2025  Ka .......................... G11C 29/38

OTHER PUBLICATIONS

Alessandro Grossi et al., "28nm Data Memory with Embedded RRAM Technology in Automotive Microcontrollers", 2023 IEEE International Memory Workshop (IMW), May 21-24, 2023, pp. 1-4.

* cited by examiner

*Primary Examiner* — Fernando Hidalgo
(74) *Attorney, Agent, or Firm* — JCIPRNET

(57) ABSTRACT

Disclosed are a data inversion encoding circuit, an eFLASH memory device and an operation method thereof. The data inversion encoding circuit includes a count and comparison circuit, receiving data with plural bits, counting numbers of 0 and 1 in the bits, and outputting a selection signal when number of 0 is larger than number of 1; an inverter, receiving the data and outputting bit inversion data; and a selection circuit, receiving the data and the bit inversion data, and selecting the data or the bit inversion data based on the selection signal. The bit inversion data is output when number of 0 is larger than number of 1.

16 Claims, 11 Drawing Sheets

DATA INVERSION ENCODING CIRCUIT, eFLASH MEMORY DEVICE AND OPERATION METHOD THEREOF

CROSS-REFERENCE TO RELATED APPLICATION

This application claims the priority benefit of Taiwan application serial no. 113120646, filed on Jun. 4, 2024. The entirety of the above-mentioned patent application is hereby incorporated by reference herein and made a part of this specification.

BACKGROUND

Technical Field

The present disclosure relates to a memory device, and in particular, to a data inversion encoding circuit, an embedded flash memory device (eFlash Memory Device) and an operation method thereof.

Description of Related Art

When an programming operation is performed on a memory such as an embedded flash (eFLASH) memory, all memory cells of the memory will first be erased to the erased state (for example, bit "1"). Thereafter, when the programming operation is performed, if there are many "0"s in the bits of the data, there will be a lot of bits that need to be programmed (programming "1"s into "0"s). Accordingly, the overall programming time will be increased, and the memory endurance will become unfavorable and the life span thereof will be shortened as well.

SUMMARY

Based on the above description, according to an embodiment, the present disclosure provides a data inversion encoding circuit. The data inversion encoding circuit includes a count and comparison circuit, receiving data with a plurality of bits, counting the number of first bit values and the number of second bit values in the plurality of bits, and outputting a selection signal; an inverter, having an input terminal and an output terminal, wherein the input terminal receives data with a plurality of bits, and inverts the bit value of each of the plurality of bits to output bit inversion data from the output terminal; a selection circuit, having a first input terminal and a second input terminal, wherein the first input terminal receives the data, the second input terminal receives the bit inversion data, and selects one of the data and the bit inversion data according to the selection signal. When the number of the first bit values is greater than the number of the second bit values, the selection circuit outputs the bit inversion data based on the selection signal.

According to another embodiment, the present disclosure provides an embedded flash (eFlash) memory device, which at least includes: a memory array and a data inversion encoding circuit. The memory array has a plurality of word lines, a plurality of bit lines, a plurality of source lines and a plurality of memory cells. The plurality of memory cells are respectively provided at a plurality of intersections of the plurality of word lines and the plurality of bit lines. Each of the plurality of word lines includes a memory cell for storing data and a memory cell for storing an inversion flag. The data inversion encoding circuit is configured to encode the data including a plurality of bits to be written to the memory array. The number of the plurality of bits is the same as the number of memory cells on each of the word lines provided to store the data. The data inversion encoding circuit includes: a count and comparison circuit, receiving the data including the plurality of bits, counting the number of first bit values and the number of second bit values in the plurality of bits, and outputting a selection signal; an inverter, having an input terminal and an output terminal, wherein the input terminal receives data with a plurality of bits, and inverts the bit value of each of the plurality of bits to output bit inversion data from the output terminal; a selection circuit, having a first input terminal and a second input terminal, wherein the first input terminal receives the data, the second input terminal receives the bit inversion data, and selects one of the data and the bit inversion data according to the selection signal. When the number of the first bit values is greater than the number of the second bit values, the selection circuit outputs the bit inversion data based on the selection signal. When the number of the first bit values is greater than the number of the second bit values, the bit inversion data is written into the memory array. When the number of the first bit values is less than the number of the second bit values, the data is written into the memory array.

According to another embodiment, the present disclosure provides an operation method of an eflash memory device. The operation method at least includes: receiving data to be written to the eflash memory device, wherein the data includes a plurality of bits; determining the number of first bit values and the number of second bit values in the plurality of bits of the data; when the number of first bit values is greater than the number of second bit values, inverting each of the plurality of bits of the data and adding an inversion flag to serve as bit inversion data; and writing the bit inversion data into the eflash memory device.

Based on the above, by using the data inversion encoding method of this embodiment to program the memory device, it is possible to significantly reduce the number of bits to be programmed each time, and the pump capability of the memory device may be decreased. In addition, through the programming method of this embodiment, unprogrammed memory cells may be directly utilized to perform the SLPD mechanism. Moreover, through this embodiment, it is also possible to detect the X-decoder driver circuit in the memory device to determine whether an error occurs.

DESCRIPTION OF THE EMBODIMENTS

Figure 1:
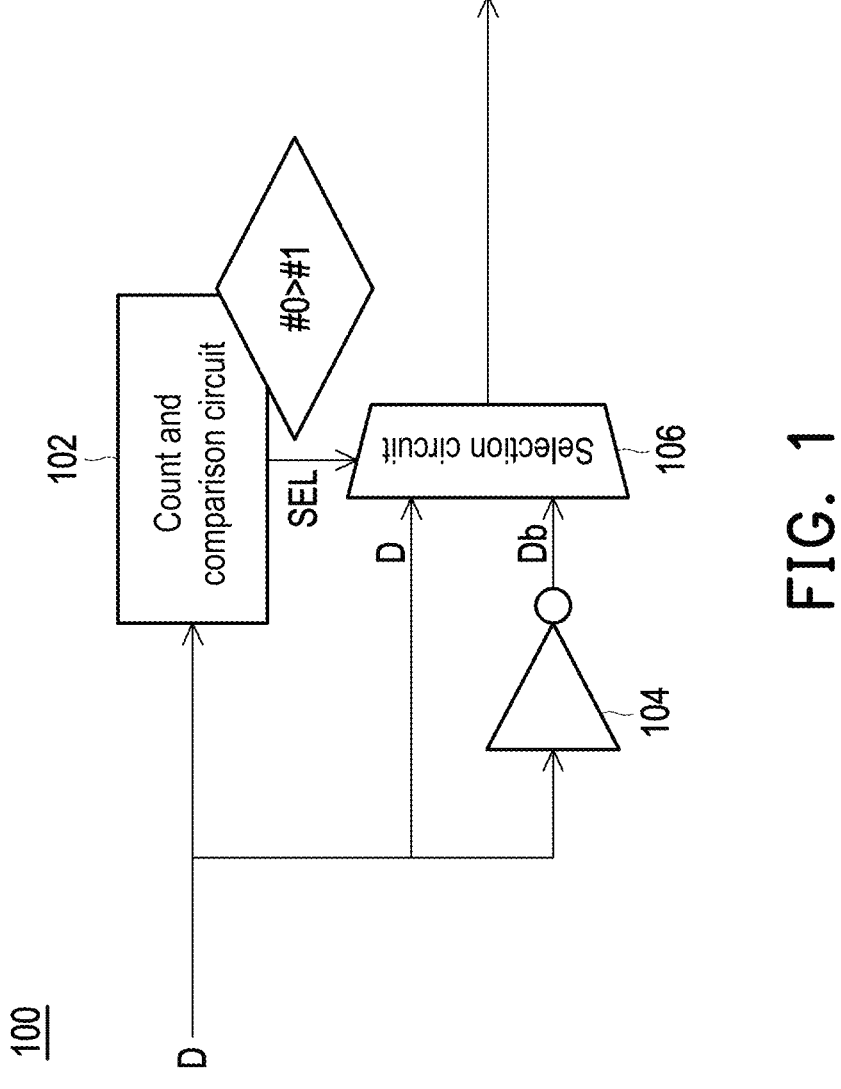
FIG. 1 is a data inversion encoding circuit illustrated according to an embodiment of the present disclosure.

FIG. 1 is a data inversion encoding circuit illustrated according to an embodiment of the present disclosure. As shown in FIG. 1, the data inversion encoding circuit 100 includes: a count and comparison circuit 102, an inverter 104 and a selection circuit 106. The count and comparison circuit 102 is configured to receive data D with a plurality of bits. The count and comparison circuit 102 counts the number of first bit values and the number of second bit values in the plurality of bits, and outputs a selection signal SEL. In this example, the first bit value may be a bit value "0", which corresponds to the programmed state, and the first bit value may be a bit value "1", which corresponds to the erased state. In addition, the count and comparison circuit 102 receives the data D with a plurality bits and inputs the data D in a parallel mode. Of course, it is not limited that the data D may be input in a serial mode.

The inverter 104 has an input terminal and an output terminal, wherein the input terminal receives the data D with a plurality of bits, and inverts the bit value of each of the plurality of bits to output the bit inversion data Db from the output terminal of the inverter 104.

The selection circuit 106 has a first input terminal and a second input terminal, wherein the first input terminal receives the data D, the second input terminal receives the bit inversion data Db, and selects one of the data D and the bit inversion data Db according to the selection signal SEL. When the number of first bit values is greater than the number of second bit values, that is, when the number of bit values "0" is greater than the number of bit values "1", the selection circuit 106 outputs the bit inversion data Db based on the state of the selection signal SEL (for example, high Level H). On the contrary, when the number of the first bit values is less than the number of the second bit values, the selection circuit 106 outputs the received data D based on the state of the selection signal SEL (e.g., low level L).

The Table 1 below summarizes the data inversion encoding method of the present disclosure and the corresponding reading method. At the beginning, it is assumed that the data stored in the memory is 01010 (taking 5 bits as an example). First, an erase operation is performed. All bits are erased to "1", that is, 11111. In the meantime, the inversion flag will also be erased to "1". Afterwards, if the data to be written into the memory is 00100, by using the above data inversion encoding method, it may be calculated that the number of "0" is 4 and the number of "1" is 1. Therefore, the number of "0"s is greater than the number of "1"s. Accordingly, the data to be written is subjected to bit inversion, that is, inverted from 00100 to 11011, and an inversion flag of "1" is attached, indicating that the data has been subjected to bit inversion. Thereafter, the inverted bit inversion data 11011 is written into the memory. Here, only one bit needs to be programmed from "1" to "0", in this way, the number of programming counts may be reduced significantly.

In addition, when a reading operation is performed, if 11011 is read out, and the inverted bit "1" is also read out, then when the read result is output, the read 11011 will be subjected to bit inversion again, so as to obtain the correct data 00100.

TABLE 1

| | Bit 0 | Bit 1 | Bit 2 | Bit 3 | Bit 4 | Inversion flag |
|---|---|---|---|---|---|---|
| Existing data | 0 | 1 | 0 | 1 | 0 | 0 |
| Erase | 1 | 1 | 1 | 1 | 1 | 1 |
| Data to be written | 0 | 0 | 1 | 0 | 0 | |
| Inverted data is written | 1 | 1 | 0 | 1 | 1 | 1 |
| Data is read | 1 | 1 | 0 | 1 | 1 | 1 |
| Read data is inverted | 0 | 0 | 1 | 0 | 0 | |

Figure 2:
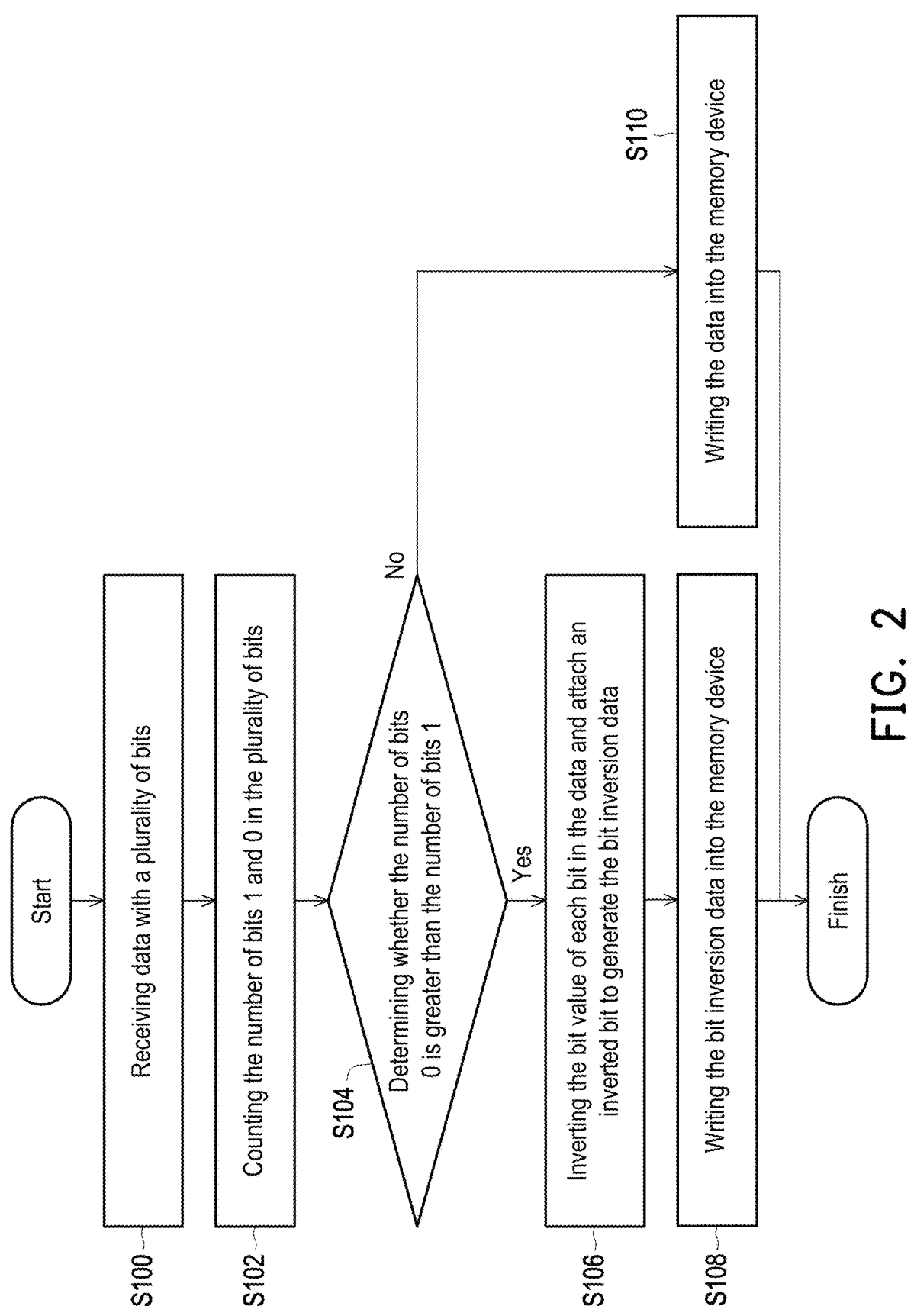
FIG. 2 is a flow chart of a programming method of a data inversion encoding method according to an embodiment of the present disclosure.

FIG. 2 is a flow chart of a programming method of a data inversion encoding method according to an embodiment of the present disclosure. As shown in FIG. 2 and referring to FIG. 1 as well, in Step S100, the memory device receives data D with a plurality of bits, and the data D is to be written to the memory device. Next, in Step S102: the number of bits 1 and 0 in the plurality of bits is counted by, for example, the count and comparison circuit 102 shown in FIG. 1.

Next, in Step S104, the count and comparison circuit 102 may further compare the number of bits 1 and 0, and determine whether the number of bits 0 is greater than the number of bits 1. When the number of bits 0 is greater than the number of bits 1, Step S106 is executed to invert the bit value of each bit in the data D and attach an inversion flag to generate the bit inversion data Db. Afterwards, in Step S108, the bit inversion data Db is written into the memory device.

In addition, when the number of bits 0 is less than the number of bits 1, Step S110 is executed to write the data D into the memory device. In the above process, the selection circuit 106 shown in FIG. 1 may be adopted to select whether to output the data D or the bit inversion data Db based on determining whether the number of bit 0 is greater than the number of bit 1.

Figure 3A:
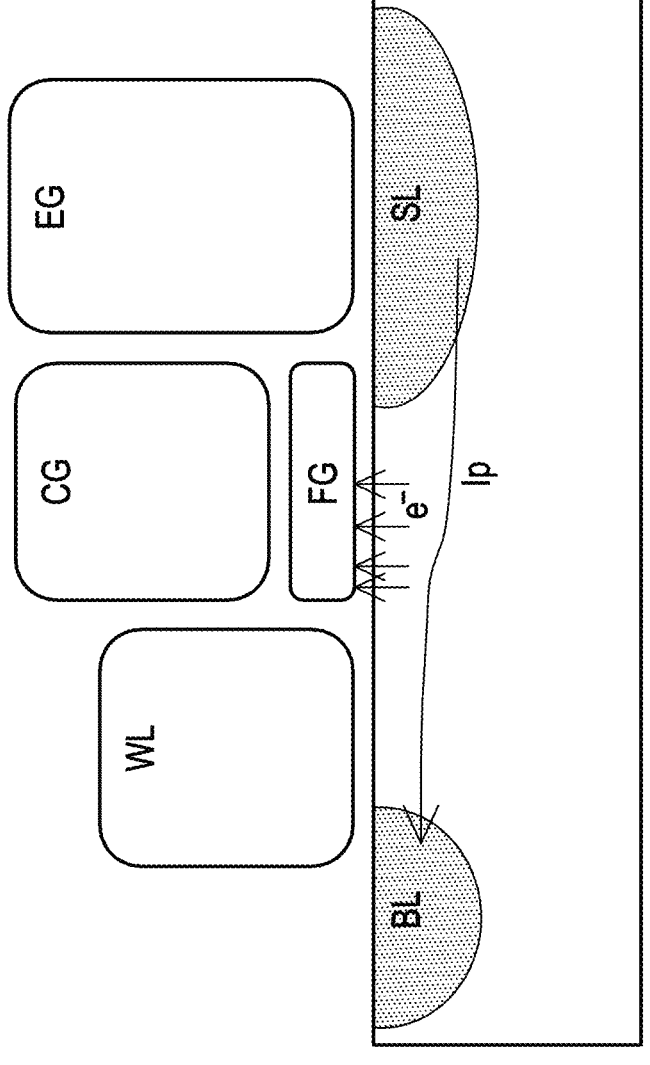
FIG. 3A and FIG. 3B are schematic diagrams of the programming mechanism of an embedded flash (eFlash) memory.
Figure 3B:
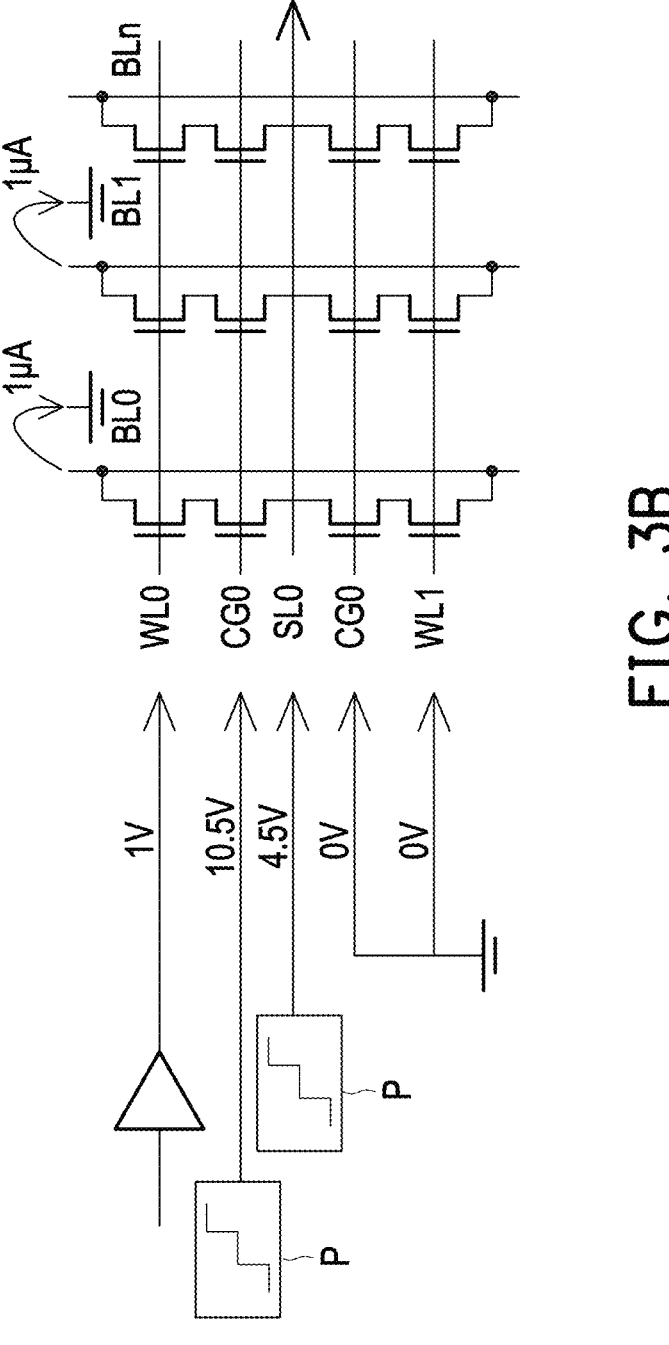

The following explains the effect of using the data inversion encoding method of the present disclosure to program the memory. FIG. 3A and FIG. 3B are schematic diagrams of the programming mechanism of an embedded flash (eFlash) memory. FIG. 3A shows a schematic cross-sectional view of a memory cell of an eflash memory. The eflash memory may substantially include an erase gate EG, a control gate CG, a floating gate FG, a bit line BL, a source line SL, etc. During the programming operation, a memory cell is selected (e.g., 1V) or not selected (e.g., 0V) by applying an appropriate voltage to the word line WL. In addition, a high voltage is applied to both the erase gate EG and the control gate CG of the selected memory cell (for example, 10.5V is applied to the control gate CG and 4.5V is applied to the erase gate EG), so that a programming current Ip is generated between the source line SL and the bit line BL. In this way, the electrons in the channel may be injected into the floating gate FG (i.e., the channel hot electron injection mechanism), whereby the erased state "1" of the memory cell may be programmed into the programmed state "0".

Therefore, both the control gate CG and the erase gate EG need to utilize the pump P as shown in FIG. 3B to boost the voltage to the required high voltage to generate the required programming current Ip. Generally speaking, assuming that the programming current Ip generated by programming a memory cell to 0 is about 1 $\mu$A, the pump capability is approximately equal to the programming current Ip multiplied by the number of bits to be programmed to "0". However, if the embodiment of the present disclosure is adopted, the number of bits actually to be programmed to "0" may be reduced through the bit inversion mechanism.

Taking a design with 144 IOs as an example, the maximum number of bits that need to be programmed to "0" is 72, so the pump capability is approximately 72 μA. Therefore, the present disclosure may help to save about 72 bits of area (about 2%). If the area of inversion bits is further included, the total reduced area may be decreased by about 1.5%. Furthermore, as the number of bits that need to be programmed decreases, the power may be reduced by at least half.

Next, the source line pull down (SLPD) capability in the eflash memory will be described. The SLPD capability is also important in eflash memory, which has a great impact on reading operation. Next, the following will describe how to use the data inversion encoding method of the present disclosure to enhance the SLPD capability.

Figure 4A:
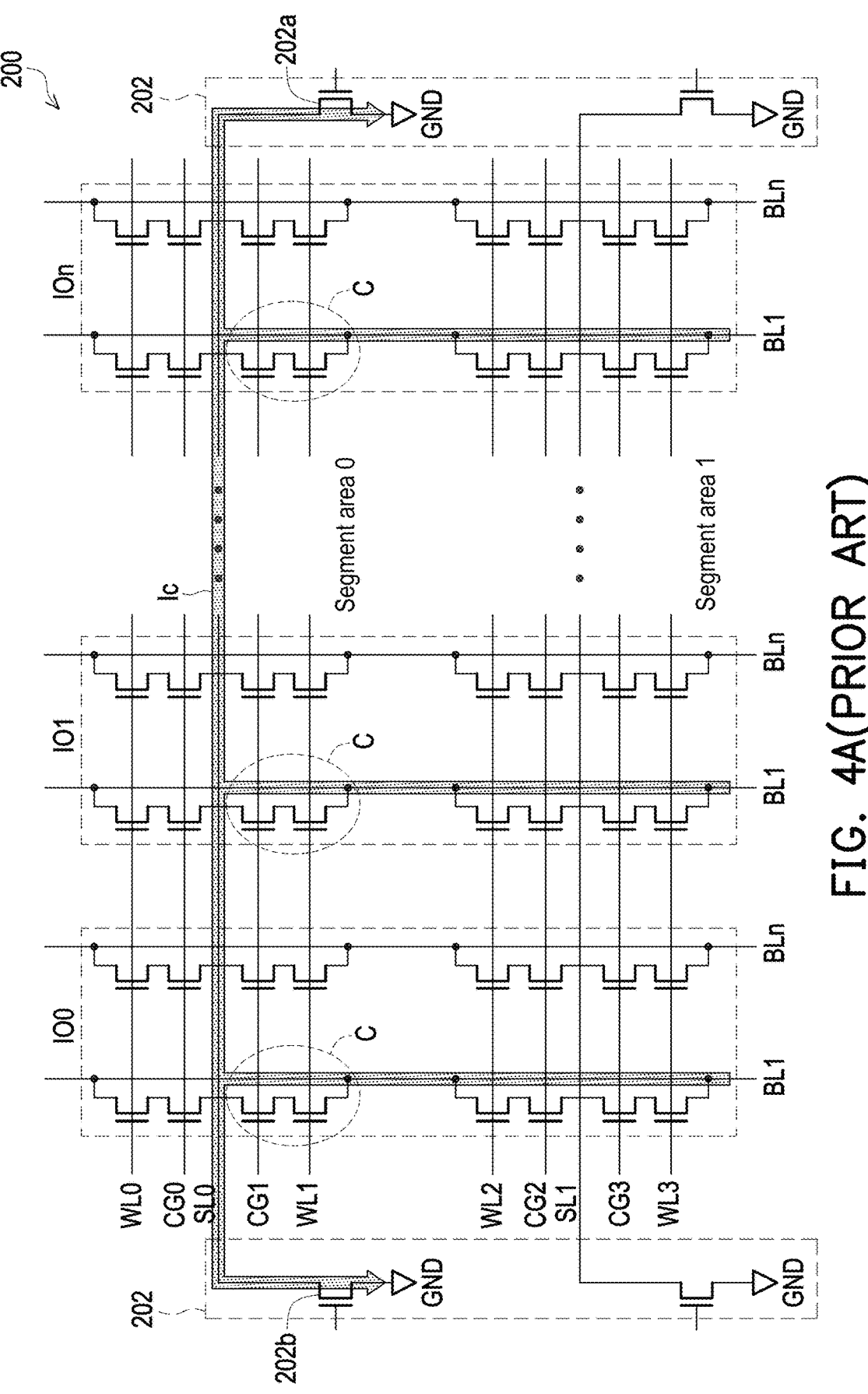
FIG. 4A and FIG. 4B are explanatory diagrams of a source line pull down mechanism in the related art.
Figure 4B:
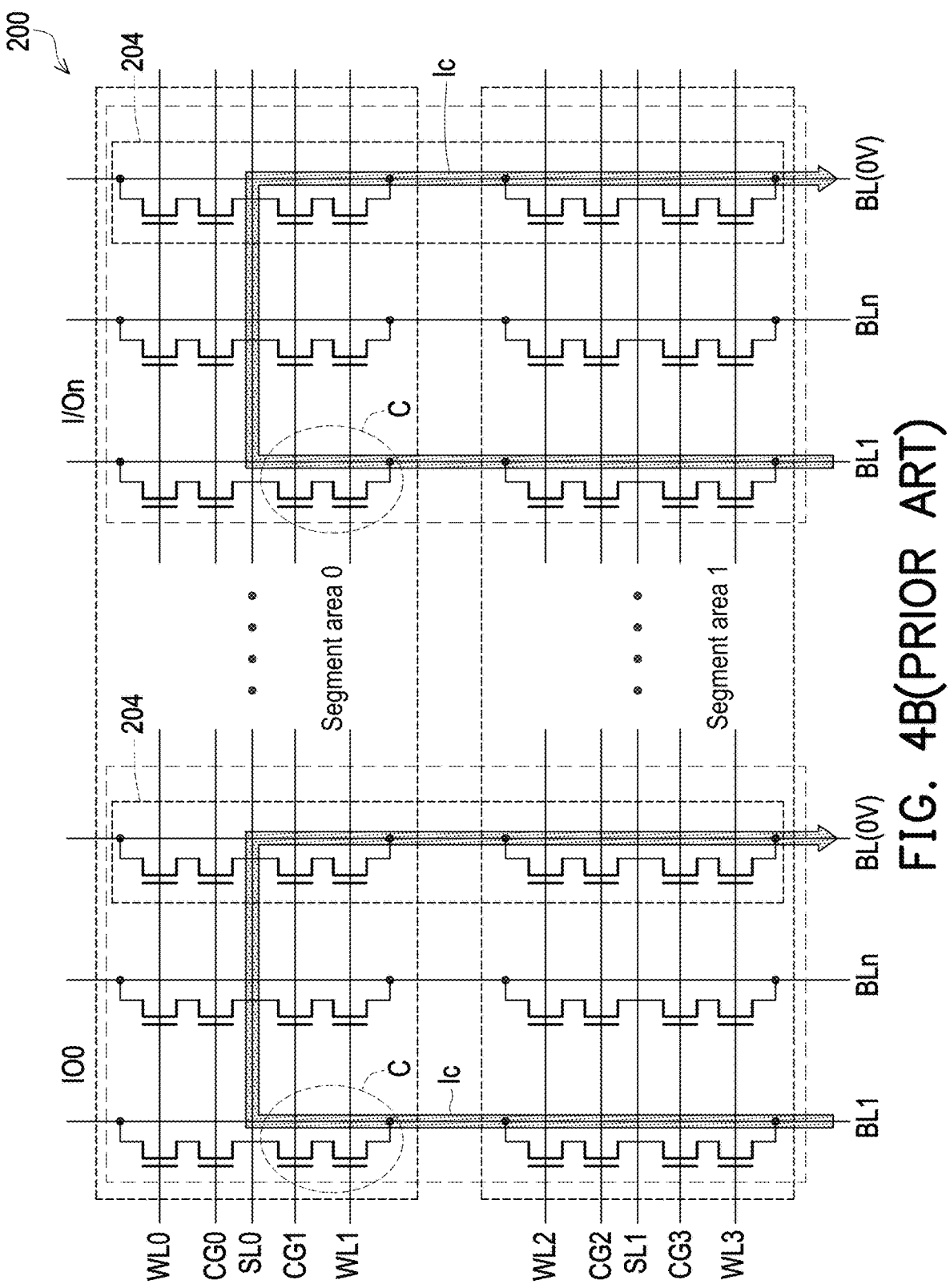

FIG. 4A and FIG. 4B are explanatory diagrams of a SLPD mechanism in the related art. The SLPD mechanism is mainly used during reading operations. In the case of reading an eflash memory, as an example, a bias voltage is normally applied to the bit line BL, such as 0.7V, while the source line SL is expected to be 0V, which is the ground potential. In this way, the memory cell current (read current) flows from the bit line BL to the source line SL (opposite to programming operation). Generally speaking, the lower the voltage of the source line SL, the greater the memory cell current will be. Typically, the memory cell current measures several milliamperes (mA). The memory cell current of a few milliamperes will simultaneously flow to the source line SL. Consequently, the metal layer of the source line SL will encounter the issue of IR drop. Therefore, during the reading operation, it becomes crucial to ensure that the voltage of the source line SL is 0V. Hence, the aforementioned SLPD mechanism is implemented.

Based on the known technology, there are two architectures that may be used to implement the SLPD mechanism; one of which is using standard IO MOS devices set outside the memory array to implement the SLPD mechanism, the other is setting up a memory cell type SLPD circuit in a memory array. The memory cell type SLPD circuit requires setting up additional dummy cells in the memory array to serve as a discharge path to pull down the voltage of the bit line SL.

FIG. 4A illustrates the use of standard IO MOS devices to implement the SLPD mechanism. As shown in FIG. 4A, the memory array 200 has multiple IO areas, namely 100 to IOn, etc. Standard IO MOS circuits 202 are provided on both sides of the memory array 200 as the discharge path of the SLPD mechanism. Taking the bit line SL0 of segment area 0 as an example, the bit line SL0 is connected to the MOS transistors 202*a* and 202*b* in the standard IO MOS circuits 202 on both sides. In this way, when a memory cell C is read, the memory cell current Ic will flow from the bit lines BL0 to BLn in each IO area to the source line SL0, and further flow to the transistors 202*a* and 202*b*, and finally the memory cell current Ic is discharged to the ground potential GND. Accordingly, the source line SL0 may be pulled down to 0V as much as possible.

FIG. 4B illustrates the use of memory cells to implement the SLPD mechanism. As shown in FIG. 4B, the memory array 200 has multiple IO areas, namely 100 to IOn, etc. The respective IO areas 100 to IOn in the memory array 200 is additionally provided with a dummy cell 204 (in a quantity of 8-bit lines). These dummy cells 204 are not used to store data. Before writing data to the memory array 200, the memory array 200 will be erased, so that all memory cells become the erased state, that is, the bit value is "1". Under the circumstances, each memory cell of the dummy cell 204 is also erased to "1". Each memory cell of the dummy cell 204 is in the erased state. Therefore, when each memory cell C is read, the memory cell current Ic of each IO area will flow from the bit lines BL0 to BLn to the source line SL0, and further flow to each memory cell of the dummy cell 204, and is finally discharged to the ground potential GND. In this way, the source line SL0 may be pulled down to 0V as much as possible.

In addition, in order to implement the SLPD mechanism using dummy cells as shown in FIG. 4B, each memory cell of the dummy cell 204 is required to be in an erased state. Therefore, before the programming operation is performed, the memory array 200 is erased first, so that all memory cells including the dummy cell 204 will be erased to "1". Furthermore, during the programming operation, the dummy cell 204 should not be programmed. Therefore, the applied voltage may be controlled during the programming operation to inhibit programming of the dummy cell 204. In this way, even when the programming operation has been performed, each memory cell of the dummy cell 204 is still in the erased state "1", so the memory cell may be used for implementing the SLPD mechanism.

However, the current SLPD mechanism will cause a lot of area to be occupied whether the standard IO MOS circuits 202 arranged outside the memory array 200 is adopted or the dummy cell 204 arranged inside the memory array 200 is adopted. Nevertheless, when the programming operation is performed using the data inversion encoding method based on the present disclosure, the standard IO MOS circuits 202 or the dummy cell 204 may be omitted.

Figure 5:
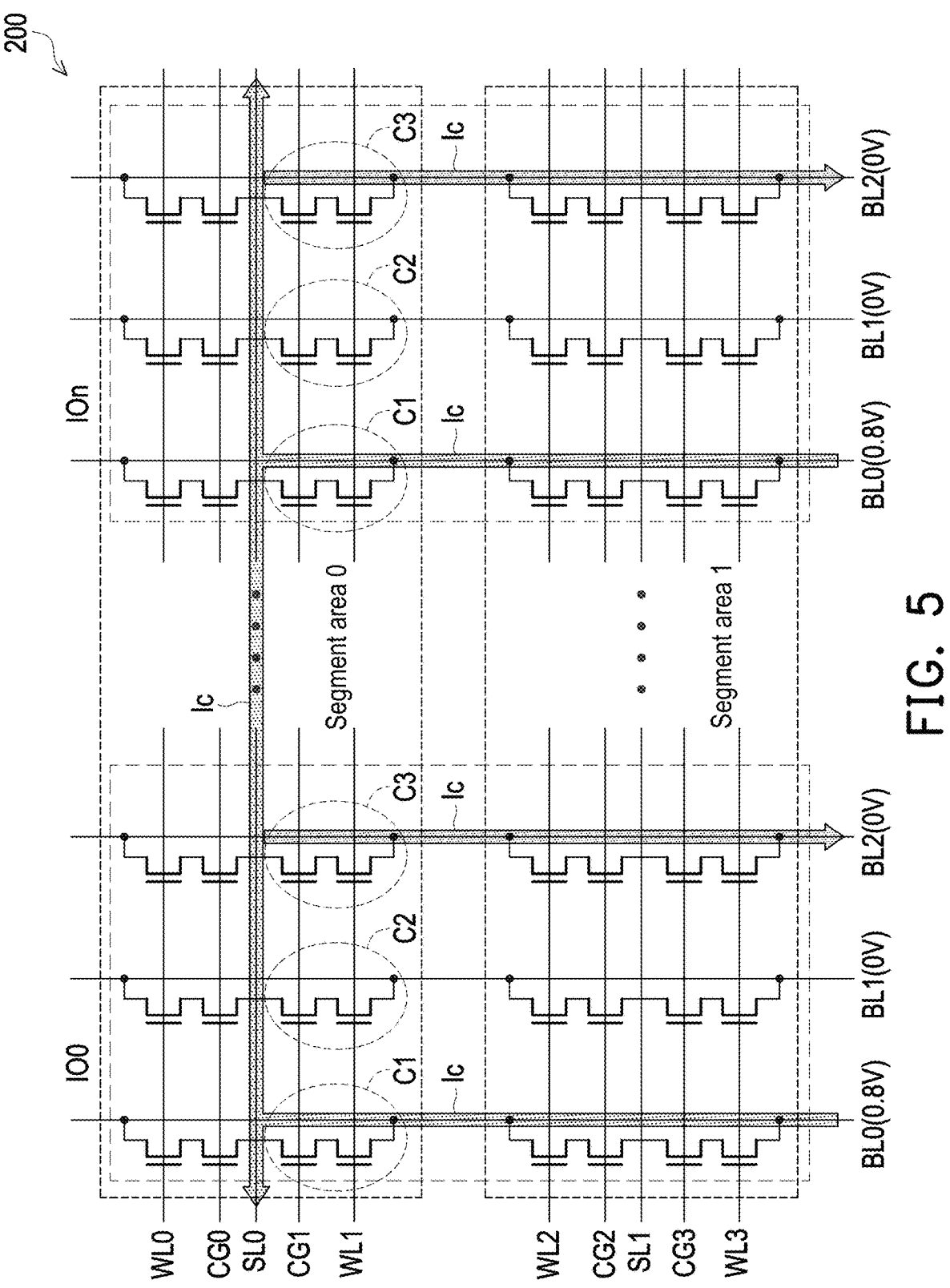
FIG. 5 is an explanatory diagram of the source pull down mechanism of the data inversion encoding method according to an embodiment of the present disclosure.

FIG. 5 shows an SLPD mechanism according to an embodiment of the present disclosure. As shown in FIG. 5, according to the data inversion encoding method of the present disclosure, when the programming operation is carried out, the unfavorable situation is that half of the bits in the written data need to be programmed, and the other half of the bits do not need to be programmed, that is, maintained in the erased state "1". Therefore, memory cells that are programmed with bits maintained in the erased state "1" may be used to implement the SLPD mechanism. As shown in FIG. 5, when the memory cell C1 is to be read, if the memory cell C2 is programmed to "0", and memory cell C3 is not programmed and maintained in the erased state "1", the memory cell current Ic may then use the memory cell C3 in the erase state "1" as a discharge path. That is, under the circumstances, the memory cell C3 is open, and the memory cell current Ic flows from the bit line BL0 to the source line SL0, and then flows to the bit line BL2 via the memory cell C3. Therefore, the voltage of the source line SL0 may be pulled down to 0V.

As mentioned above, according to the data inversion encoding method of the present disclosure, when the memory array 200 is subjected to the programming operation, half of each word line WL will be programmed at worst, but at least half of the memory is in the erased state "1". Therefore, the present disclosure may utilize these memory cells in the erased state "1" as the discharge path of the SLPD mechanism. In other words, the present disclosure does not require setting up a standard IO MOS circuit 202 outside the memory array 200 or a dummy cell 204 inside the memory array 200 to implement the SLPD mechanism. Because the present disclosure only requires setting up a small number of memory cells to store the inversion flag, the area efficiency of the memory device may be significantly improved.

Moreover, in the above-mentioned method of realizing the SLPD mechanism of the present disclosure, the programming results may be achieved by applying channel hot electron injection or Fowler-Nordheim tunneling effect.

Figure 6:
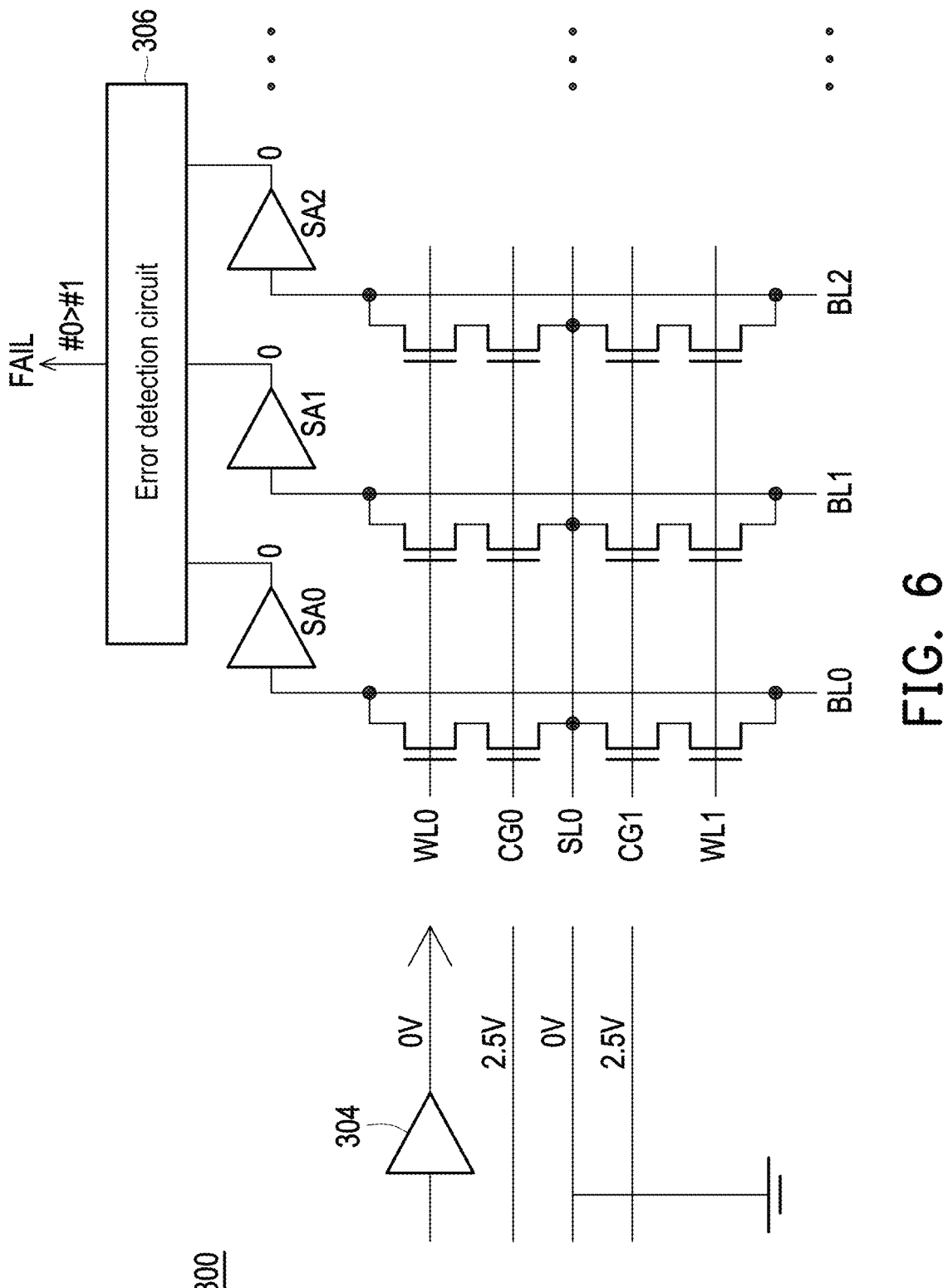
FIG. 6 is an architectural schematic diagram of error detection of an X-decoder driver circuit illustrated according to an embodiment of the present disclosure.

In addition, the eflash memory is generally suitable for applications of vehicle-mounted computer. The data inversion encoding method of the present disclosure is also suitable for detecting whether the X-decoder driver circuit in the memory device is damaged or failed. FIG. 6 is an architectural schematic diagram of error detection performed by the X-decoder driver circuit according to an embodiment of the present disclosure.

As shown in FIG. 6, the eflash memory device 300 at least includes a memory array 302, a plurality of X-decoder driver circuits 304, a plurality of sense amplifiers SA0, SA1, SA2, . . . , and an error detection circuit 306, etc. Of course, the eflash memory device 300 may also include other required circuits, which may be designed and planned by those skilled in the art.

The memory array 302 includes a plurality of word lines (e.g., WL0, WL1) and a plurality of bit lines (BL0, BL1, BL2, . . . ). A plurality of memory cells are arranged at the intersections of each word line and each bit line. In the case of eflash memory, two memory cells share one source line SL, and only one source line SL is shown in FIG. 6. Each memory cell also includes a control gate CG and an erase gate EG (omitted, please refer to the example architecture shown in FIG. 3A). In addition, each word line WL0, WL1, . . . includes a memory cell for storing data and a memory cell for storing an inversion flag. The number of memory cells that store data is the same as the number of bits that are written into the data, and the memory cells that store the inversion flag may be memory cells that store 1 bit.

A plurality of X-decoder driver circuits 304 (only one is shown in FIG. 6 as an example) are respectively coupled to each word line WL0, WL1, and so on for driving each word line WL0, WL1 respectively. A plurality of sense amplifiers SA0, SA1, SA2 and so on are respectively coupled to the bit lines BL0, BL1, BL2 and so on of the memory array 302. The error detection circuit 306 is coupled to the output of each sense amplifier SA0, SA1, SA2, . . . , and is configured to detect whether one of the plurality of X-decoder driver circuits 304 has an error. When a reading operation is performed, typically a word line is selected to read each memory cell thereon. For example, when a word line WL0 is selected, each memory cell on the word line WL0 is read, and the memory cell current generated during reading flows to the corresponding sense amplifiers SA0, SA1, SA2, . . . , thereby determining whether each bit of the read data is "0" or "1".

In addition, after the error detection circuit 306 receives the bits read by the sense amplifiers SA0, SA1, SA2 . . . , the number of the first bit value (i.e. "0") and the number of the second bit value (i.e. "1") are counted. Afterwards, the error detection circuit 306 determines whether the number of first bit values output by the sense amplifiers SA0, SA1, SA2, . . . is greater than the number of second bit values. When the number of the first bit values is greater than the number of the second bit values, it is determined that the X-decoder driver circuit 304 on the word line WL0 has an error. Under the circumstances, the error detection circuit 306 outputs the error signal FAIL to notify the upper controller or processor that an error has occurred in the X-decoder driver circuit 304 in the eflash memory device 300.

In this way, the data inversion encoding method of the present disclosure may also be applied to detect whether there is an error in the X-decoder driver circuit 304 of the eflash memory device 300. In addition, the error detection circuit 306 may be disposed in the eflash memory device

300, and the memory side determines whether an error occurs in the X-decoder driver circuit 304. Of course, the user terminal may also be disposed outside the eflash memory device 300 and the user terminal may design the configuration of the error detection circuit 306.

Figure 7A:
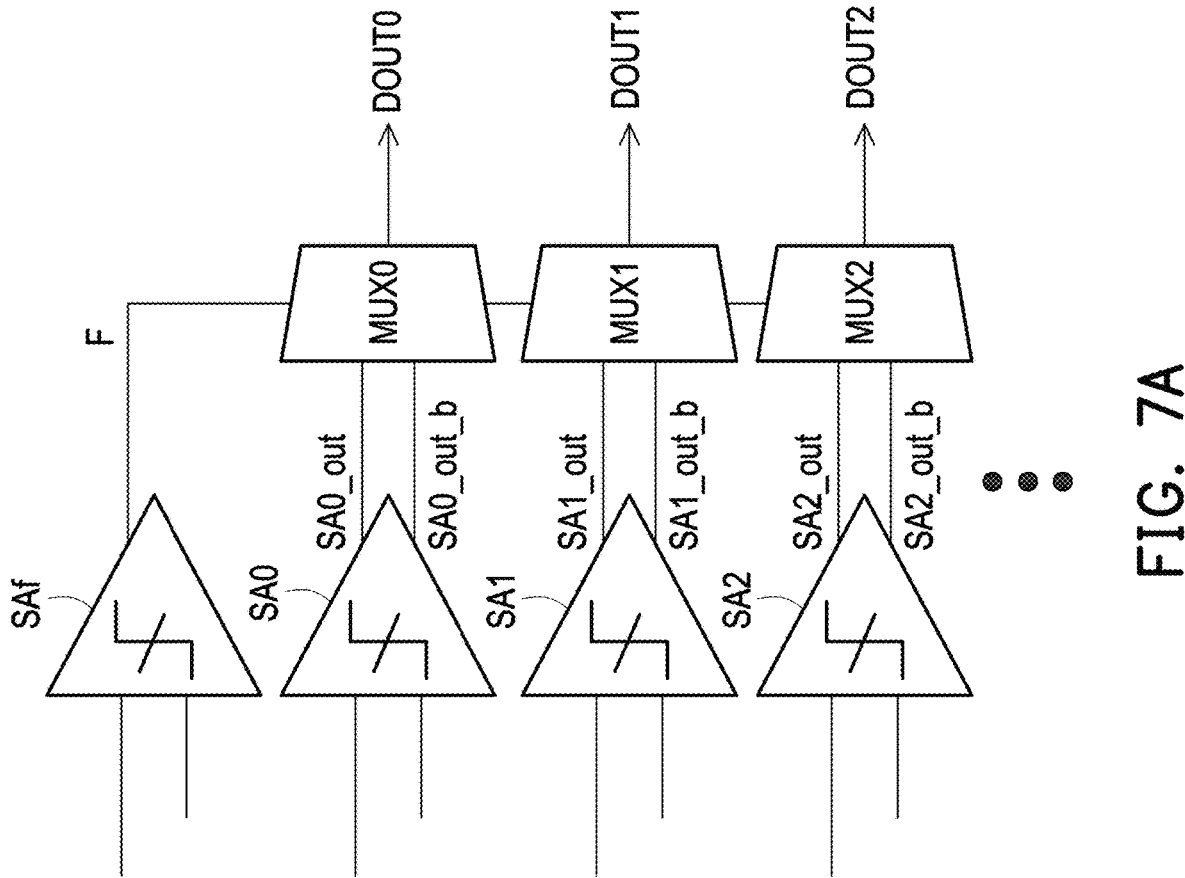
FIG. 7A and FIG. 7B are schematic diagrams of a read circuit based on a data inversion encoding method according to an embodiment of the present disclosure.
Figure 7B:
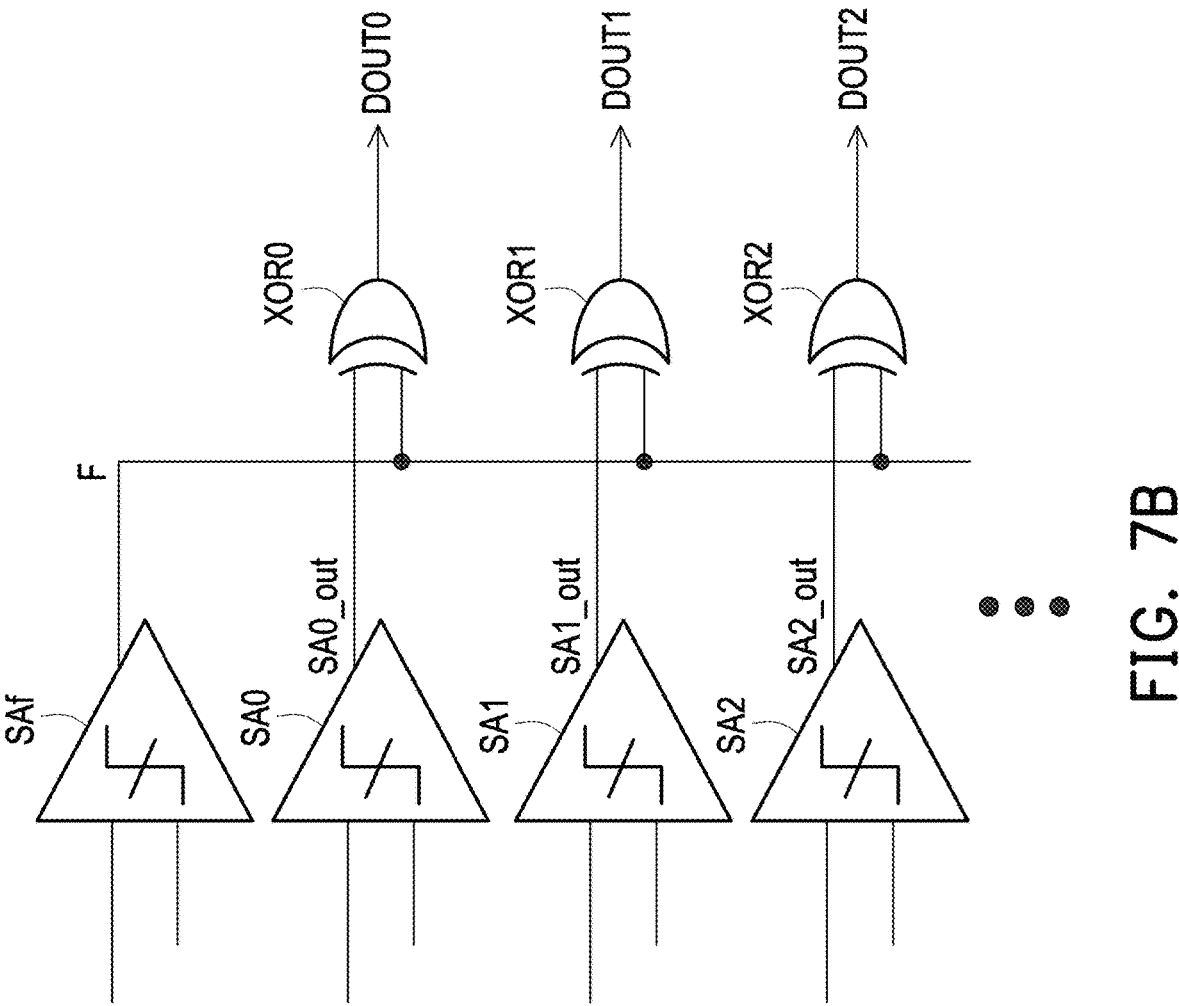

FIG. 7A and FIG. 7B are schematic diagrams of a read circuit based on the data inversion encoding method according to an embodiment of the present disclosure. In the above description, it is described how to use the data inversion encoding method to program the memory device. Now it will be explained how to read the data programmed in this way.

FIG. 7A exemplifies the use of multiplexers for reading operations. In addition, FIG. 7A does not illustrate the structure of the memory array, and the memory array 302 shown in FIG. 6 may be adopted. The inputs of multiple sense amplifiers SA0, SA1, SA2 and so on are respectively coupled to the bit lines corresponding to each memory cell for storing data. The sense amplifiers SA0, SA1, SA2 and so on may respectively output a pair of complementary output signals/inverted output signals, such as SA0_out/SA0_out_b, SA1_out/SA1_out_b, SA1_out/SA1_out_b, etc.

In addition, a plurality of multiplexers MUX0, MUX1, MUX2, . . . are further included to be respectively arranged corresponding to the sense amplifiers SA0, SA1, SA2, etc., and respectively receive a pair of output signals SA0_out/SA0_out_b, SA1_out/SA1_out_b, SA1_out/SA1_out_b and so on from each sense amplifiers SA0, SA1, SA2, etc.

In addition, an inversion flag sensing amplifier SAf for sensing the inversion flag F is also provided, the inversion flag sensing amplifier SAf is coupled to the bit line of the memory cell storing the inversion flag F for reading the inversion flag F. The inversion flag F output from the inversion flag sensing amplifier SAf is further input to each multiplexer MUX0, MUX1, MUX2, etc.

Based on the value of the inversion flag F, each multiplexer MUX0, MUX1, MUX2, etc. may select one of a pair of output signals SAi_out and SAi_out_b of each sense amplifier SAi, where i=0 to n, and n is an integer. For example, when the inversion flag is "0", it means that the data is written without undergoing bit inversion. Therefore, each multiplexer MUX0, MUX1, MUX2 and so on may select the output signal SAi_out of each sense amplifier SAi for use as readout signals DOUT0, DOUT1, DOUT2 and so on. On the contrary, when the inversion flag is "1", it means that the data is written with bit inversion, so each multiplexer MUX0, MUX1, MUX2 and so on may select the output signal SAi_out_b of each sense amplifier SAi for use as readout signals DOUT0, DOUT1, DOUT2 and so on. In this way, the written data may be read out through this architecture.

FIG. 7B exemplifies the use of XOR gates for reading operations. In addition, FIG. 7B does not illustrate the structure of the memory array, and the memory array 302 shown in FIG. 6 may be adopted. The inputs of multiple sense amplifiers SA0, SA1, SA2 and so on are respectively coupled to the bit lines corresponding to each memory cell for storing data. The sense amplifiers SA0, SA1, SA2 and so on may respectively output output signals, such as SA0_out, SA1_out, SA2_out, etc.

Additionally, a plurality of XOR gates, such as XOR0, XOR1, XOR2 and so on are further included, which are respectively configured corresponding to sense amplifiers SA0, SA1, SA2, etc., and respectively receive output signals SA0_out, SA1_out, SA2_out and so on from respective sense amplifiers SA0, SA1, SA2, etc.

In addition, an inversion flag sensing amplifier SAf for sensing the inversion flag F is also provided, and the inversion flag sensing amplifier SAf is coupled to the bit line of the memory cell storing the inversion flag F for reading the inversion flag F. The inversion flag F output by the inversion flag sensing amplifier SAf is further input to each XOR0 gate, such as XOR0, XOR1, XOR2, etc.

Based on the value of the inversion flag F being "0", that is, the written data is not subjected to bit inversion, each XOR gate, such as XOR0, XOR1, XOR2 and so on may directly output the output signals SA0_out, SA1_out, and SA2_out of each sense amplifiers SA0, SA1, SA2 for use as readout signals DOUT0, DOUT1, DOUT2 and so on. On the contrary, if the value of the inversion flag F is "1", that is, the written data is subjected to bit inversion, then each XOR gate performs an XOR logic operation on the output signal of each sense amplifier and the value of the inversion flag F to generate inversion output signals, which are used as the readout signals DOUT0, DOUT1, DOUT2 and so on. In this way, the written data may be readout through such architecture.

Figure 8:
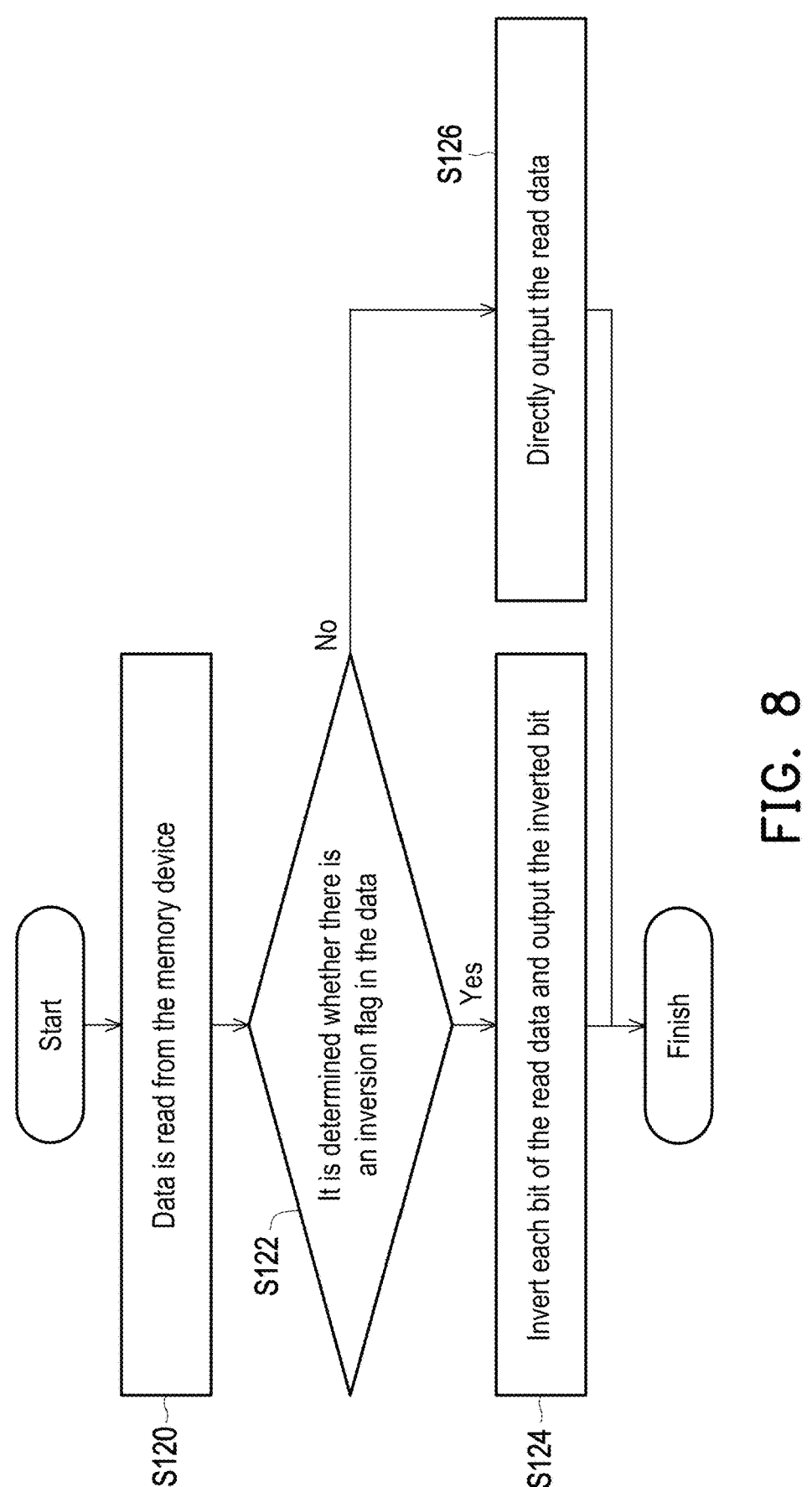
FIG. 8 is a flow chart of a reading method of the data inversion encoding method illustrated according to an embodiment of the present disclosure.

FIG. 8 is a flow chart of a reading method of the data inversion encoding method illustrated according to an embodiment of the present disclosure. First, the writing of data to the memory device is performed through the above-mentioned data inversion encoding method. As shown in FIG. 8, in Step S120, data is read from the memory device, such as through the architecture of FIG. 7A or FIG. 7B. Next, in Step S122, it is determined whether there is an inversion flag in the data, for example, whether the inversion flag sense amplifier SAf in FIG. 7A or FIG. 7B has an inversion flag that outputs "1".

Thereafter, when the inversion flag of "1" is detected in Step S122, Step S124 is executed to invert each bit of the read data and output the inverted bit. On the contrary, when the inversion flag of "1" is not detected in Step S122, Step S126 is executed to directly output the read data.

To sum up, by using the data inversion encoding method of the present disclosure to program the memory device, the number of bits that need to be programmed each time may be greatly reduced, and the pump capability of the memory device may be greatly decreased. Moreover, through the programming method of the present disclosure, there is no need to additionally set up external MOS circuits or dummy cells to execute the SLPD mechanism, and unprogrammed memory cells may be directly used to perform the SLPD mechanism. Furthermore, through the method of the present disclosure, the X-decoder driver circuit in the memory device may also be detected to determine whether an error occurs.

What is claimed is:

1. A data inversion encoding circuit, comprising:
a count and comparison circuit, receiving a data with a plurality of bits, counting a number of bits with a first bit value and a number of bits with a second bit value in the plurality of bits, and outputting a selection signal;
an inverter, having an input terminal and an output terminal, wherein the input terminal receives the data with the plurality of bits, and inverts a bit value of each of the plurality of bits to output bit inversion data from the output terminal;
a selection circuit, having a first input terminal and a second input terminal, wherein the first input terminal receives the data, the second input terminal receives the bit inversion data, and selects one of the data and the bit inversion data according to the selection signal, wherein when the number of the bits with the first bit value is greater than the number of the bits with the second bit value, the selection circuit outputs the bit inversion data based on the selection signal.

2. The data inversion encoding circuit according to claim 1, wherein the first bit value corresponds to a programmed state, and the second bit value corresponds to an erased state.

3. The data inversion encoding circuit according to claim 1, wherein the selection circuit is a multiplexer.

4. The data inversion encoding circuit according claim 1, wherein the plurality of bits of the data are input to the data inversion encoding circuit in a parallel mode.

5. The data inversion encoding circuit according to claim 1, wherein the data inversion encoding circuit is disposed in an embedded flash (eFlash) memory device, and the eflash memory device at least comprises:
a memory array, having a plurality of word lines, a plurality of bit lines, a plurality of source lines and a plurality of memory cells, wherein the plurality of memory cells are respectively disposed at a plurality of intersections of the plurality of word lines and the plurality of bit lines, each of the plurality of word lines comprises a memory cell for storing the data and a memory cell for storing an inversion flag,
wherein the data inversion encoding circuit is configured to encode the data to be written to the memory array, a number of the plurality of bits is the same as a number of the memory cells on each of the word lines provided to store the data,
wherein when the number of the bits with the first bit value is greater than the number of the bits with the second bit value, the bit inversion data is written into the memory array,
when the number of the bits with the first bit value is less than the number of the bits with the second bit value, the data is written into the memory array.

6. The data inversion encoding circuit according to claim 5, wherein after writing the data or the bit inversion data, when one bit of the data or the bit inversion data is read, other bits that are different from the bit and have a memory cell with the second bit value serve as a source line discharge path for a memory cell current.

7. The data inversion encoding circuit according to claim 5, wherein writing of the data or the bit inversion data is performed by applying a channel hot electron injection or a Fowler-Nordheim tunneling effect.

8. The data inversion encoding circuit according to claim 5, wherein the eflash memory device further comprises:
a plurality of sense amplifiers, respectively coupled to each of the plurality of bit lines of the memory array, configured to sense a value of each of the plurality of bits of the data, and each of the plurality of sense amplifiers outputting an output signal and an inverted output signal respectively;
an inversion flag sense amplifier, coupled to a bit line of the memory cell storing the inversion flag, and configured to read the inversion flag;
a plurality of multiplexers, respectively receiving the output signal and the inverted output signal output by the corresponding plurality of sense amplifiers, as well as the inversion flag,
wherein when the inversion flag is the second bit value, each of the plurality of multiplexers outputs the inverted output signal.

9. The data inversion encoding circuit according to claim 5, wherein the eflash memory device further comprises:

a plurality of sense amplifiers, respectively coupled to each of the plurality of bit lines of the memory array, configured to sense a value of each of the plurality of bits of the data, and each of the plurality of sense amplifiers outputting an output signal respectively;

an inversion flag sense amplifier, coupled to a bit line of the memory cell storing the inversion flag, and configured to read the inversion flag;

a plurality of XOR gates, each of the plurality of XOR gates receiving the output signal corresponding to each of the plurality of sense amplifiers and the inversion flag, and outputting the output signal or an inverted output signal of the output signal based on a value of the inversion flag.

10. The data inversion encoding circuit according to claim 5, wherein the eflash memory device further comprises:

a plurality of X-decoder driver circuits, respectively coupled to the plurality of word lines for driving each of the plurality of word lines respectively;

a plurality of sense amplifiers, respectively coupled to each of the plurality of bit lines of the memory array; and an error detection circuit, coupled to outputs of the plurality of sense amplifiers for detecting whether one of the plurality of X-decoder driver circuits has an error, wherein the error detection circuit further counts the number of the bits with the first bit value and the number of the bits with the second bit value output by the plurality of sense amplifiers, when the number of the bits with the first bit value output by the plurality of sense amplifiers is greater than the number of the bits with the second bit value, one of the plurality of X-decoder driver circuits is determined to have an error.

11. The data inversion encoding circuit according to claim 10, wherein the error detection circuit is disposed within the eflash memory device.

12. An operation method of an embedded flash (eFlash) memory device, at least comprising:

receiving a data to be written to the eflash memory device, wherein the data comprises a plurality of bits;

determining a number of bits with a first bit value and a number of bits with a second bit value in the plurality of bits of the data;

wherein when the number of the bits with the first bit value is greater than the number of the bits with the second bit value, inverting each of the plurality of bits of the data and adding an inversion flag to the data to generate bit inversion data; and writing the bit inversion data into the eflash memory device.

13. The operation method of the eflash memory device according to claim 12, wherein the first bit value corresponds to a programmed state, and the second bit value corresponds to an erased state.

14. The operation method of the eflash memory device according to claim 12, further comprising a reading operation, wherein when reading the eflash memory device, if the inversion flag is detected, each bit of the bit inversion data is inverted to output the data.

15. The operation method of the eflash memory device according to claim 12, wherein when the number of the bits with the first bit value is less than the number of the bits with the second bit value, writing the data to the eflash memory device.

16. The operation method of the eflash memory device according to claim 12, wherein before writing is performed to the eflash memory device, the eflash memory device is erased first.

* * * * *